United States Patent
Weimer (10) Patent No.: US 11,067,629 B2
(45) Date of Patent: Jul. 20, 2021

(54) AUTOMATED TEST EQUIPMENT FOR TESTING HIGH-POWER ELECTRONIC COMPONENTS

(71) Applicant: Teradyne, Inc., North Reading, MA (US)

(72) Inventor: Jack E. Weimer, Gurnee, IL (US)

(73) Assignee: Teradyne, Inc., North Reading, MA (US)

( * ) Notice: Subject to any disclaimer, the term of this patent is extended or adjusted under 35 U.S.C. 154(b) by 69 days.

(21) Appl. No.: 16/429,668

(22) Filed: Jun. 3, 2019

(65) Prior Publication Data

US 2020/0379043 A1  Dec. 3, 2020

(51) Int. Cl.
*G01R 31/28* (2006.01)
*G01R 31/319* (2006.01)
(Continued)

(52) U.S. Cl.
CPC ... *G01R 31/31905* (2013.01); *G01R 31/2834* (2013.01); *G01R 31/3167* (2013.01); *G01R 31/31727* (2013.01); *G01R 31/31922* (2013.01); *G01R 31/318307* (2013.01); *H03K 5/131* (2013.01)

(58) Field of Classification Search
CPC .......... G01R 31/31905; G01R 31/3167; G01R 31/31727; G01R 31/318307; G01R 31/31922; G01R 31/2608–2619; H03K 5/131
See application file for complete search history.

(56) References Cited

U.S. PATENT DOCUMENTS 3,350,641 A * 10/1967 Lubkin .............. G01R 31/2608
324/762.08
5,861,774 A * 1/1999 Blumenthal ....... G01R 31/2884
324/750.3
(Continued)

FOREIGN PATENT DOCUMENTS

CN 109581177 A * 4/2019
JP 2013-113607 A 6/2013

OTHER PUBLICATIONS

Sparkes, Measuring Circuits used in an Automatic Transistor Tester,https://ieeexplore.IEEE.org/stamp/stamp.jsp?tp=&arnumber=5261195 (Year: 1962).*
(Continued)

*Primary Examiner* — Patrick Assouad
*Assistant Examiner* — Demetrius R Pretlow
(74) *Attorney, Agent, or Firm* — Wolf, Greenfield & Sacks, P.C.

(57) ABSTRACT

Aspects of the present application are directed to an automated test equipment (ATE) and methods for operating the same for testing high-power electronic components. The inventor has recognized and appreciated an ATE that provides both high-power alternating-current (AC) and direct-current (DC) testing in a single test system can lead to high throughput testing for high-power components with reduced system hardware complexity and cost. Aspects of the present application provide a synchronized inductor switch module and both a high-precision digitizer and a high-speed digitizer for capturing DC and AC characteristics of a high-power transistor.

24 Claims, 9 Drawing Sheets

(51) Int. Cl.
*G01R 31/317* (2006.01)
*G01R 31/3167* (2006.01)
*H03K 5/131* (2014.01)
*G01R 31/3183* (2006.01)

(56) References Cited

U.S. PATENT DOCUMENTS

| | | |
|---|---|---|
| 9,989,584 B2 * | 6/2018 | Weimer ............ G01R 31/2879 |
| 10,698,020 B2 | 6/2020 | Weimer |
| 2009/0052256 A1 * | 2/2009 | Sutardja ................ G11C 16/06 |
| | | 365/185.19 |
| 2009/0279337 A1 * | 11/2009 | Hamatani ................ B60L 3/12 |
| | | 363/132 |
| 2011/0193586 A1 | 8/2011 | Kuo et al. |
| 2012/0081139 A1 * | 4/2012 | Yoshida ................ G01R 31/42 |
| | | 324/750.16 |
| 2012/0206150 A1 | 8/2012 | Holzer |
| 2013/0027066 A1 | 1/2013 | Charbuillet et al. |
| 2015/0078048 A1 | 3/2015 | Lin |
| 2015/0226787 A1 * | 8/2015 | Mankel .................... G01K 7/01 |
| | | 702/64 |
| 2015/0276799 A1 | 10/2015 | Weimer |
| 2015/0276803 A1 | 10/2015 | Weimer |
| 2017/0254842 A1 * | 9/2017 | Bahl .................. G01R 19/0084 |
| 2018/0159521 A1 * | 6/2018 | Tsurumaru ........... H03K 17/127 |
| 2018/0348292 A1 * | 12/2018 | Takita ................ G01R 31/2601 |
| 2019/0250046 A1 * | 8/2019 | Sun .......................... H02M 1/08 |
| 2020/0182924 A1 * | 6/2020 | Shapiro ................. G01R 23/16 |

OTHER PUBLICATIONS

PCT/US2020/035659, Sep. 16, 2020, International Search Report and Written Opinion.

International Search Report and Written Opinion in connection with International Application No. PCT/US2020/035659, dated Sep. 16, 2020.

* cited by examiner

AUTOMATED TEST EQUIPMENT FOR TESTING HIGH-POWER ELECTRONIC COMPONENTS

BACKGROUND

Electronic components, such as semiconductor devices, circuits, and printed circuit board (PCB) assemblies, are frequently tested, during and after their manufacture, using a test system such as an automated test equipment (ATE). To perform these tests, an ATE may include instruments that generate or measure test signals such that a range of operating conditions can be tested on a particular device-under-test (DUT). An instrument, for example, may generate a pattern of digital or analog signals that are applied to a semiconductor device, and may measure digital or analog signals from the semiconductor device as a response.

High-power electronic components are used to provide power to machinery and vehicles with electric-drivetrains, including electric and hybrid electric automobiles. Full function testing of high-power electronic components is an important part of the manufacturing process for motor drive components.

SUMMARY

Aspects of the present application are directed to an automated test equipment (ATE) and methods for operating the same for testing high-power electronic components. The inventor has recognized and appreciated an ATE that provides both high-power alternating-current (AC) and direct-current (DC) testing in a single test system can lead to high throughput testing for high-power components with reduced system hardware complexity and cost. Aspects of the present application provide a synchronized inductor switch module and both a high-precision digitizer and a high-speed digitizer for capturing DC and AC characteristics of a high-power transistor.

According to some embodiments, a method for operating an automated testing equipment (ATE) to test an insulated-gate bipolar transistor (IGBT) in a device under test (DUT) is provided. The method comprises turning on the IGBT; driving a current from an energy source unit (ESU) through the IGBT via an inductor; measuring a plurality of current waveforms through and voltage waveforms across the IGBT; and processing the plurality of measured current waveforms and voltage waveforms to obtain at least one alternating-current (AC) characteristic and at least one direct-current (DC) characteristic of the IGBT.

According to some embodiments, an automated test equipment (ATE) for testing a device under test (DUT) is provided. The ATE comprises an energy source unit (ESU) comprising an ESU output; a switch module configured to couple a transistor in the DUT to the ESU output via an inductor; a first digitizer configured to measure a voltage of the transistor; a second digitizer configured to measure the voltage of the transistor with a lower voltage resolution than the first digitizer; and a third digitizer configured to measure a current of the transistor.

According to some embodiments, a method for operating an automated testing equipment (ATE) to test a first insulated-gate bipolar transistor (IGBT) in a device under test (DUT) is provided. The method comprises turning on the first IGBT to cause a first current to flow from an energy source unit (ESU) output of an ESU towards a reference voltage via a first circuit path. The first circuit path comprises an inductor, a first switch coupled between the inductor and the ESU output, and the first IGBT. The method also comprises measuring, with a first digitizer, a first characteristic of the first IGBT; measuring, with a second digitizer having a lower voltage resolution than the first voltage digitizer, a second characteristic of the first IGBT.

The foregoing is a non-limiting summary of the invention, which is defined by the appended claims.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

The inventor has appreciated and recognized that with the increase in commercial demand for more advanced electric motors, there is a need for test systems that can provide high throughput testing for motor drive components at higher voltages, higher currents, and faster test times. This is especially true for automotive motor drive applications where product quality and production costs must be carefully optimized. While alternating-current (AC) and direct-current (DC) tests have conventionally been performed using different test techniques and on distinctively different test hardware, disclosed herein are examples of an ATE that can perform AC and DC tests of motor drive component using a common ATE hardware, and the methods for operating such ATE hardware. Embodiments of the present disclosure may provide improved test efficiency for motor drive components, lower test system cost, reduced test system size and complexity, faster test time, and reduced development time and cost.

One example of high-power motor drive components that can be tested with the ATE as described herein is an insulated gate bipolar transistor (IGBT), which is used to provide high efficiency pulsed power to various motor windings to control rotational direction, power, and speed of the electric motor. The IGBT may comprise an internal fast recovery diode (FRD).

Described herein are examples of ATE for testing a device under test (DUT) that may be a high-power electronic component for a motor drive, and in some embodiments, for testing a transistor in the DUT. The ATE may be configured to provide testing of both AC and DC characteristics of the transistor in the same hardware, therefore eliminating the need for separate high-power test system hardware and associated interconnections to the DUT to carry out the two type of tests.

In some embodiments, the ATE includes an energy source unit (ESU) configured to provide high voltage and current supply to drive the transistor being tested. The transistor is coupled to the ESU via an inductor within an inductor switch module (ISM) in the ATE. When the transistor is turned on, current is supplied through a first current path from the ESU, through the inductor, through the transistor, and eventually to a reference voltage such as a circuit ground. Current through and voltages across the transistor are digitized by the ATE for testing various characteristics of the transistor, as will be discussed in more detail below. The inductor stores energy within the inductor flux, such that the inductor current does not abruptly turn off when the transistor is turned off during dynamic testing of the transistor's AC characteristics. When the transistor is turned off, switches within the ISM may divert the inductor current to another circuit path, or short the inductor via a dissipation path to allow for safe shut down when testing of the transistor is completed to reduce the risk of an inductive kick from sudden change of the high amount of current supplied with the ESU.

An ATE as described herein may provide a plurality of tests on the transistor in the DUT. In particular, aspects of the present application are directed to providing AC and DC testing capability of high-power electronic components such as high-power transistors in a DUT. AC testing is performed to verify high-speed AC characteristics of transistors such as switching energy, turn-on and turn-off time, diode reverse recovery, etc. DC testing is performed to verify DC characteristics such as saturation voltage, diode forward voltage, off state collector leakage, gate leakage, gate threshold voltage, etc.

AC testing may be performed when the transistor is dynamically switched on and off, while the ISM in the ATE forces a dynamically varying amount of current through the transistor. Analog current through the transistor and voltages across the transistor are measured through a plurality of instruments within the ATE, and digitized as measured current and voltage signals for storage and further processing. In some embodiments, a current digitizer in the ATE is used to measure a current of the transistor versus time, while one or more high-speed voltage digitizers measure various voltages across the transistor versus time. The measured time-domain current and voltage waveforms during AC testing may be analyzed to measure high-speed characteristics of the transistor. For example, during AC testing, the ATE may measure current and voltage of the transistor around a switch transition between an on-state and an off-state of the transistor to measure characteristics such as switching energy, turn-on and turn-off time, etc.

The inventor has recognized and appreciated that traditionally, a DC test for high-power transistors is performed in a separate testing hardware to provide higher current levels than those used for AC testing, for example 2 times higher or more. The high current level demands a certain voltage and current sources (VIs) in the ATE with high cost and complexity and the interconnect hardware such as heavy gauge cabling for connection to a device interface board (DIB) and then the DUT. According to an aspect of the present application, DC testing may be performed using the same ATE on the transistor, during a time period when the transistor is turned on. Therefore the requirement for a separate hardware providing high-power VI and interconnects can be eliminated. For example, the ATE may measure a voltage as a function of a ramping current by a high-precision voltage digitizer and a current digitizer during a period when the transistor is turned on and current is flowing through the transistor. By using a single ATE to perform both AC and DC testing on high-power electronic components, test system cost may be lowered and the time for testing may be reduced.

According to an aspect, the high-precision voltage digitizer for the DC testing has a higher voltage resolution compared to the voltage resolution of the one or more high-speed voltage digitizers used in the AC testing of the transistor, because DC testing is performed during the on-period where the voltage swing being measured is in a low voltage range compared to the much larger voltage transition range of sometimes 100 V or more being measured in the AC testing. For example, the high-precision voltage digitizer may operate in a low voltage dynamic range of 5 or 10 V, while the high-speed voltage digitizer measures a dynamic range of hundreds of volts between the on-state and the off-state of the transistor. Therefore even if both types of digitizers have similar analog-to-digital bit resolutions such as a 16-bit resolution, the voltage resolution of the high-precision voltage digitizer is much higher than that of the high-speed voltage digitizer.

According to an aspect, the ISM comprises a plurality of switches that operate based on a plurality of synchronized timing control signals. The plurality of synchronized timing control signals also control switching of the transistor being tested in the DUT, such that the switches are operated to cause a current to flow or to be forced to flow from the ESU through the transistor when the transistor is on to allow measurement on the transistor to be performed, and to divert the current through an alternative current path away from the transistor when the transistor is off. Furthermore, the plurality of synchronized timing control signals also control measurements the high-speed voltage digitizers, high-precision voltage digitizers and current digitizers, for example by only turning on respective digitizers when measurements at the digitizer is needed. Synchronizing measurement sampling of current and corresponding voltage values also allows analysis of a voltage-current relationship, for example during an on state of a transistor, which allows certain DC testing to be performed. In one embodiment, a pattern based timing control engine is provided in the ATE that generates the plurality of synchronized timing control signals.

The ATE may provide testing of more than one transistor, according to an aspect. For example, the transistor in the DUT may be a lower IGBT, and the DUT comprises a second, upper IGBT. Both IGBTs and their internal FRD may be tested for their AC and DC characteristics using the ATE as described herein. In one embodiment, when the lower IGBT is turned off, switches within the ISM are configured to redirect the inductor current via a second circuit path to flow through the upper IGBT, and characteristics of the IGBT may be tested by the ATE.

Figure 1:
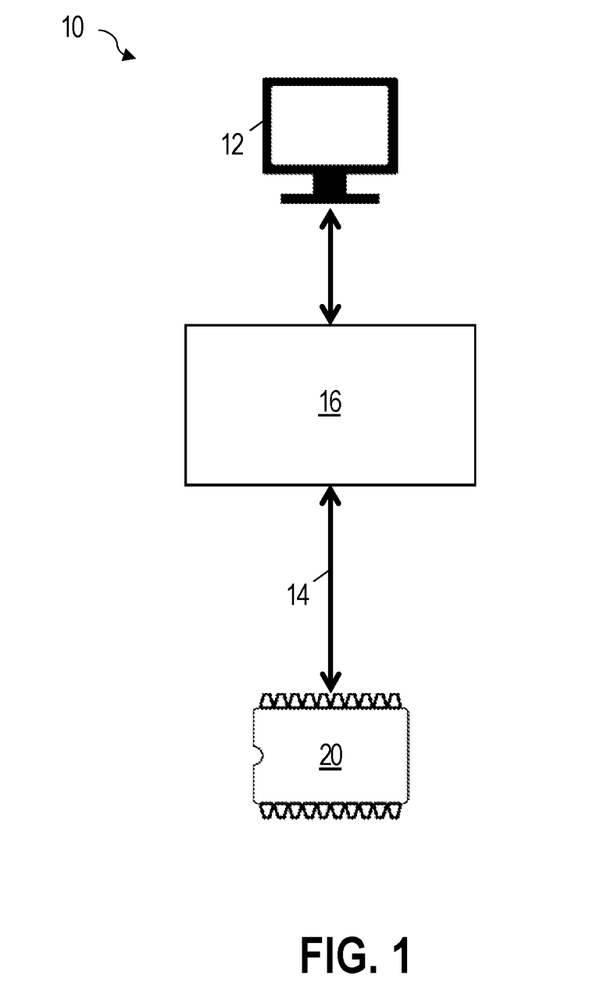
FIG. 1 is a high-level schematic diagram of an exemplary ATE according to aspects of the present application.

FIG. 1 is a high-level schematic diagram of an exemplary ATE according to aspects of the present application. FIG. 1 illustrates a test system 10 that contains a test computer 12 that controls a tester 16 to perform tests on a device under test (DUT) 20 in accordance to methods disclosed in the present application. In some scenarios, the tester 16 may be an automated test equipment (ATE), constructed using techniques that are known in the art. The DUT 20 may be any suitable device for testing. For example, DUT 20 may be a high-power transistor such as a IGBT used in a motor drive. ATE 16 may contain circuitry to generate and/or measure a test signal 14 for DUT 20. ATE 16 may include multiple instruments configured to generate or measure different types of analog or digital signals.

It should be appreciated that FIG. 1 is a greatly simplified representation of an automated test system. For example, though not illustrated, test system 10 may include control circuitry that controls operation of instruments within ATE 16. Additionally, test system 10 may include processing circuitry to process measurements and determine whether a DUT 20 is operating correctly. A device interface board (DIB) may optionally and additionally be provided to connect contact points on the DUT to corresponding test points of instruments within ATE 16. Also, FIG. 1 illustrates a single signal path between ATE 16 and DUT 20. One of skill in the art will appreciate that testing a high-power DUT may require hundreds or thousands of test signals to be generated and measured. Accordingly, circuitry as described herein may be duplicated many times within ATE 16 and controlled to provide synchronized test signals for testing DUT 20. Further, though FIG. 1 illustrates a scenario in which a single DUT 20 is being tested, test system 10 may be configured to test multiple devices.

Regardless of the number of instruments or other components generating or measuring test signals and the number of devices under test, test system 10 may include signal delivery components that route the signals between the DUT 20 and the instruments within ATE 16.

Further, it should be appreciated that other components as illustrated are exemplary rather than limiting. For example, although the test computer 12 is illustrated as a personal computer (PC) in FIG. 1, it should be appreciated that any suitable computing device may be used to implement a test computer, for example, a mobile device or a computer work station. Test computer 12 may be connected to a network and capable of accessing resources over the network and/or communicate with one or more other computers connected to the network.

Figure 2:
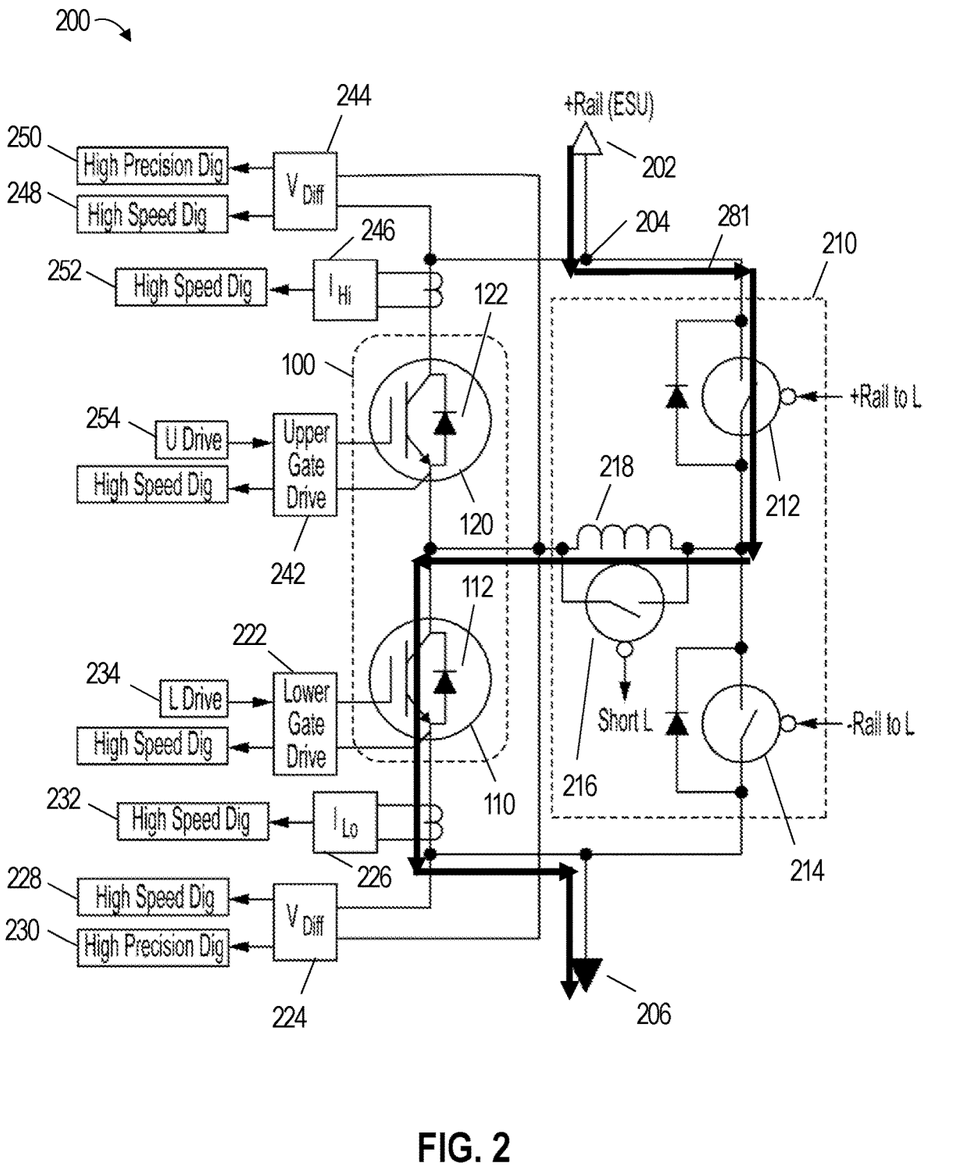
FIG. 2 is a schematic diagram showing an exemplary ATE during a first test phase for testing high-power components, according to some aspects.

FIG. 2 is a schematic diagram showing an exemplary ATE 200 during a first test phase for testing high-power components, according to some aspects. FIG. 2 shows a DUT 100 comprising a lower IGBT 110 with internal fast recovery diode (FRD) 112, and an upper IGBT 120 with internal FRD 122. Switching of lower IGBT 110 is controlled by lower gate drive 222 based on a synchronized timing control signal 234. Switching of upper IGBT 120 is controlled by lower gate drive 242 based on a synchronized timing control signal 254.

An ESU 202 is provided to deliver large high-speed current pulses for AC test purposes at an ESU output 204. ESU 202 may be a programmable voltage source, or a programmable current source. To test high-power transistors, ESU 202 may generate signals covering voltages ranging beyond 1500 V and currents of at least 3000 A, at least 4000 A, or beyond 5000 A. In some embodiments, ESU 202 may also comprise a fast-acting high-side circuit breaker to protect the instruments within the ATE from DUT shorts during testing. According to an aspect, circuit paths between the ESU and the DUT have low path inductance to avoid inductive over-voltage spiking. In some embodiments, the ESU may be designed to operate from a bank of large value storage capacitors which are charged by a programmable current limited voltage source.

ISM 210 comprises switches 212, 214, 216 and inductor 218. Switches 212, 214, 216 are operated based on respective synchronized timing control signals +Rail to L, −Rail to L and Short L. In some embodiments, switches 212, 214 and 218 are high-power solid state switches.

The ATE provides a current meter 226 for measuring emitter current of lower IGBT 110. The current measurement is digitized in a high-speed current digitizer 232. Voltage meter 224 provides measurement of a voltage difference across the lower IGBT collector and emitter, and is digitized by a high-speed voltage digitizer 228 and a high-precision digitizer 230. A current meter 246 measures collector current through upper IGBT 120. The current measurement is digitized in a high-speed current digitizer 252. Voltage meter 244 provides measurement of a voltage difference across the upper IGBT collector and emitter, and is digitized by a high-speed voltage digitizer 248 and a high-precision digitizer 250.

In the example shown in FIG. 2, current meter 226 is an inductively coupled current monitor, although any suitable current measuring technique may also be employed. The inventor has recognized and appreciated that inductively coupled current monitors typically offer ∼±1% accuracy and may be less than certain high-power VIs typically used for high-power electronics testing. A forced current guard-banding technique may be used to mitigate the effect of accuracy reduction by appropriately increasing the test condition demand while not significantly impacting production yield. According to an aspect, the test technique can be modified to over-range the forced current level a small amount (∼2%) used for measuring $V_{CE}$(sat) and V(forward).

During the first test phase as shown in FIG. 2, lower IGBT 110 is turned on, and switches 212 and 218 in the ISM 210 are turned on to allow a current to flow via a circuit path 281 from ESU output 204, through switch 212, inductor 218, lower IGBT 110 toward a reference voltage 206.

AC and DC testing of the IGBTs shown in FIG. 2 will be described in more detail with reference to the exemplary waveforms in FIG. 3.

Figure 3:
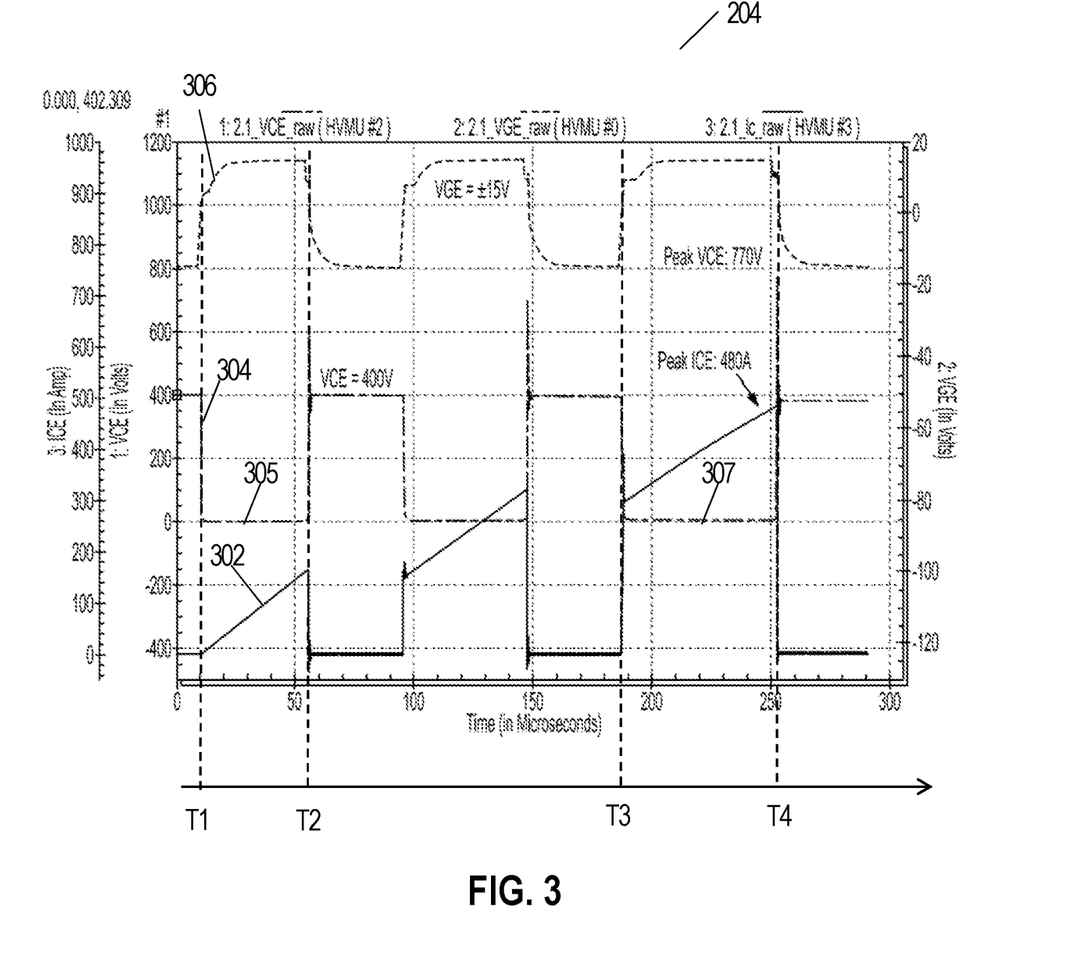
FIG. 3 are time domain waveforms of current and voltage signals measured from an ATE as described herein, according to some aspects.

FIG. 3 are time domain waveforms of current and voltage signals measured from an ATE as described herein, according to some aspects. In FIG. 3, waveform 302 shows beginning at time T1, a collector current of the lower IGBT 110 as shown in FIG. 2 ramping up over time, for example as a result of a programmable current forced from the ESU output 204 through the lower IGBT 110 via circuit path 281 as shown in FIG. 2. The peak current level during the ramp may depend on the pulse duration between T1 and T2, as well as the value of the inductor 218. The collector current shown in waveform 302 may be measured by current meter 226 and digitized by digitizer 232.

Still referring to FIG. 3, waveform 304 shows a collector to emitter voltage ($V_{CE}$) of the lower IGBT 110 as a function of time as IGBT 110 is being switched on and off. The collector to emitter voltage may be measured, for example, by voltage meter 224 and digitized by high-speed digitizer 228 for the AC testing, or by high-precision digitizer 230 for the DC testing.

During the time period between T1 and T2, the lower IGBT 110 is turned on, and a DC testing can be performed using a synchronized voltage signals 305 digitized with high-precision voltage digitizer 230, with synchronized current signals $I_{CE}$ 302 between T1 and T2. By digitizing the current at synchronized timings with the voltage, it is possible to correlate the forcing condition with the measured response. The synchronized voltage-current relationship may be processed to provide tests for high-power DC characteristics of the lower IGBT 110 such as but not limited to saturation voltage $V_{CE}$(sat), on-state resistance $R_{DS}$(on). Any technique known in the art for processing $V_{CE}$-$I_{CE}$ to obtain such characteristics may be used in the DC testing.

Referring back to FIG. 2, during DC testing the high-precision digitizer 230 is used to a relatively small voltage change, for example to measure voltage signals 305 within waveform 304 as shown in FIG. 3. In some embodiments, high-precision digitizer 230 may be a high sample rate timing controlled differential or floating input high-precision DC voltmeter operating in a low voltage range of 0 to 5 V, 0 to 10 V, 0 to 20 V, or 0 to 50 V full-scale with a digitization bit resolution of at least 12-bit, at least 14 bit or at least 16-bit, thereby providing a high voltage resolution based on the binarization within a low voltage range. For example, a 16-bit analog-to-digital converter with a full scale range of 10 V has a voltage resolution of $10V/2^{16}$ or approximately 0.15 mV based on the digitization bit resolution. It should be appreciated that depending on the bandwidth of the measurement, voltage resolution may also depend on the noise in the digitizer.

In some embodiments, the high-precision digitizer are input protected by limiting a voltage at the digitizer to be within a predetermined voltage range, to protect the digitizer from overvoltage conditions as a result of the high $V_{CE}$ value and high peak $V_{CE}$ value that can be in the order of hundreds of volts in between the on-state and the off-state transitions.

The first test phase as shown in FIG. 2 may be used repeatedly to force increasing amount of high current from the ESU through the lower IGBT. For example, as shown in FIG. 3, during period T3 to T4, a high forced current of up to 480 A is driven through the lower IGBT, and a DC measurement can be performed based on synchronized voltage signal 307 measured by the high-precision digitizer versus synchronized current signal 302. In some embodiments, DC testing of the lower IGBT may be performed by an ATE according to the present disclosure at a forced current of at least 1000 A, at least 2000 A, at least 3000 A, at least 4000 A, or between 3000 A and 5000 A.

AC testing is performed based on signals measured around a transition between an on-state and an off-state of the IGBT, as discussed in detail below. In some embodiments, AC switching energy tests are initiated by gating an IGBT such as lower IGBT 110 on and off using the current developed in an inductive load to create the current needed for testing. When an appropriate amount of time has passed and the current has reached an appropriate level, the IGBT is turned off for a brief time before being turned on again while the various digitizers capture the resulting voltage and current waveforms. This sequence is sufficient to provide turn-off and turn-on waveforms which test one IGBT paired with one FRD such as IGBT 110 and FRD 122 creating a complete set of switching energy waveforms as shown in FIG. 3. Multiple test conditions can be sequenced back-to-back assuming data is desired at a number of unique test currents.

Referring back to FIG. 3, waveform 306 shows a gate to emitter voltage ($V_{GE}$) as a function of time for lower IGBT 110, which controls of the lower IGBT 110 between an on or conductive state, and an off or non-conductive state. At time T2, when the lower IGBT 110 is switched off based on control signals 234, the inductive kick from inductor 218 drives the collector voltage rapidly upward and forward biases the upper FRD 122 in upper IGBT 120. Examples of the current flow after time T2 is illustrated in FIG. 4.

Figure 4:
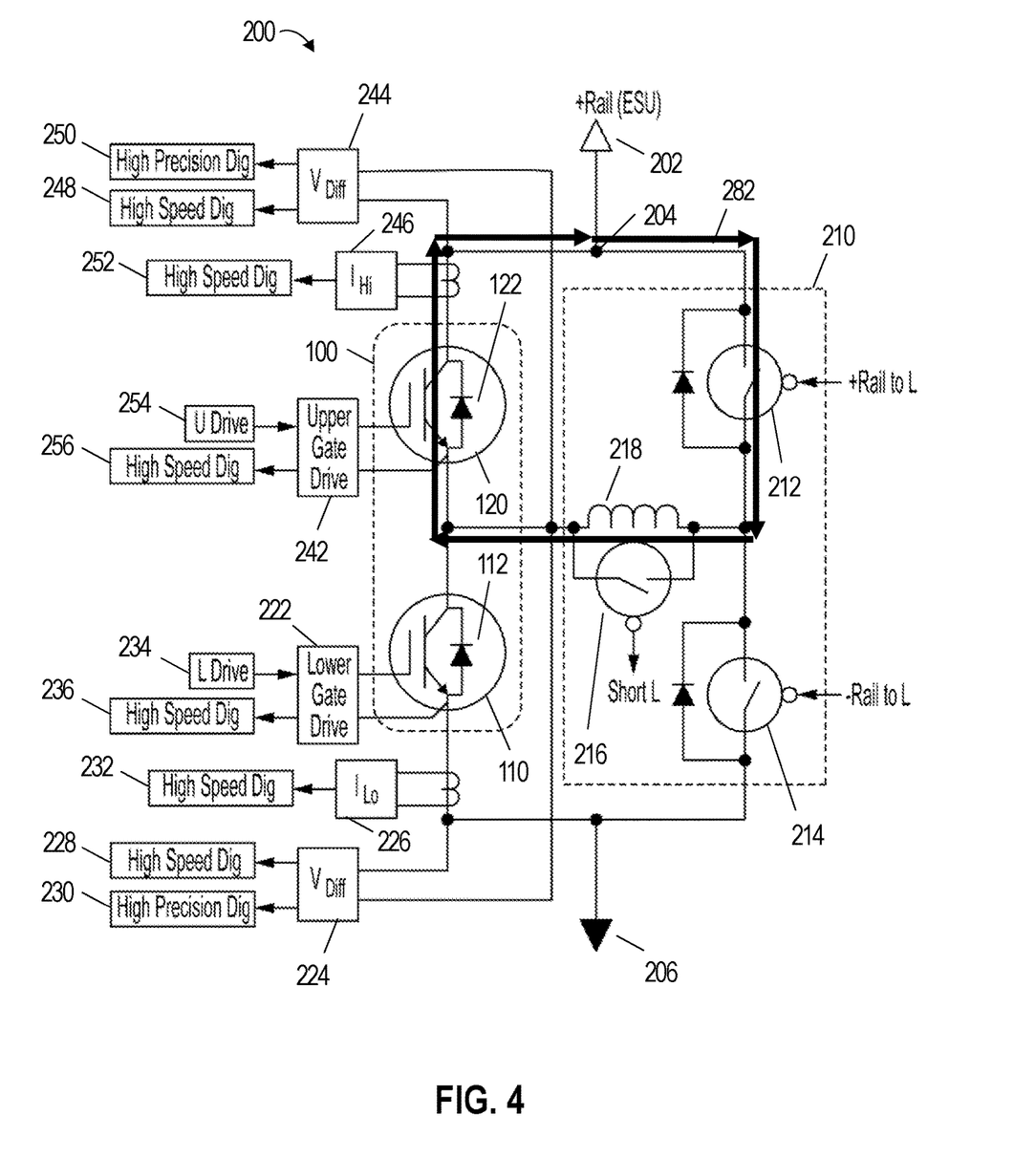
FIG. 4 is a schematic diagram showing the exemplary ATE during a second test phase for testing high-power components, according to some aspects.

FIG. 4 is a schematic diagram showing the exemplary ATE 200 during a second test phase for testing high-power components, according to some aspects. FIG. 4 shows a circuit path 282 for a current flow through the upper FRD 122, when the inductor 218 is fluxed and the lower IGBT 110 is turned off. The $V_{CE}$ and $V_{GE}$ during the off to on transition of the lower IGBT 110 may be digitized. The current passing through the upper FRD may also be digitized during testing via current meter 246. Digitizers can be gated on or off at various times throughout a sequence as needed to capture the desired information necessary for testing AC characteristics.

Testing of AC characteristics such as turn-on and turn-off switching energy of the lower IGBT 110 may be determined by calculation using the digitized voltage and current waveform data 304 and 302 as operands with any technique known in the art. In particular, voltage across the lower IGBT 110 is digitized with a high-speed digitizer 228 that operates in a high voltage range of for example 0 to 1000 V full-scale to allow capture of the large voltage swing during the AC transitions as illustrated in the exemplary waveform 304 in FIG. 3. As a result, high-speed digitizer 228 has a lower voltage resolution compared to high-precision voltage digitizer 230. The same ATE 200 may also be used for testing AC characteristics of the upper IGBT 120 and the lower FRD 112. Other examples of AC characteristics that may be obtained include but are not limited to gate charge $Q_g$(on) of the lower IGBT, the reverse recovery time $t_{rr}$ and reverse recovery current $I_{rr}$ of the upper FRD.

Figure 5:
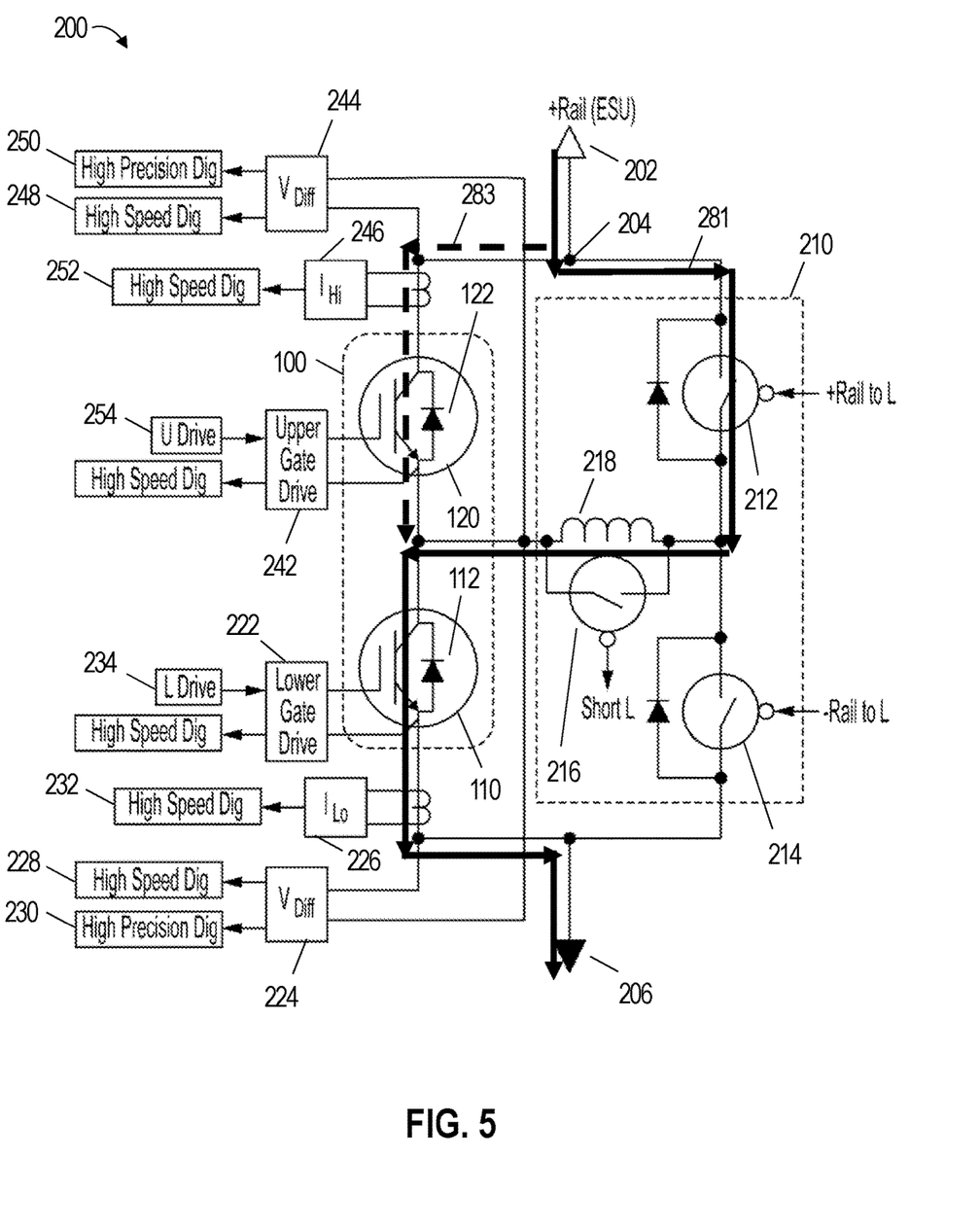
FIG. 5 is a schematic diagram showing the exemplary ATE during a third test phase for testing high-power components, according to some aspects.

FIG. 5 is a schematic diagram showing the exemplary ATE 200 during a third test phase for testing high-power components, according to some aspects. FIG. 5 shows that when lower IGBT 110 is turned back on again, current through inductor 218 restarts fluxing the inductor by pulling current from the ESU via circuit path 281 through the lower IGBT 110. AC measurement of the turn-on energy of the lower IGBT 110 may be performed during such a transition from off-state to on-state based on the measured voltage and current signals.

In addition, the inventor has recognized and appreciated that in some embodiments, the FRD 122 in the upper IGBT 120 may continue to conduct for a short period of time after the lower IGBT 110 is turned-on due for example to delays in hole migration, causing a current through circuit path 283 as shown in FIG. 5 which increases the peak current demand on the lower IGBT 110. Such a reverse recovery response of the upper FRD 122 may be digitized by voltage and current digitizers 250, 248 and 252, and used to characterize the FRD 122.

Figure 6:
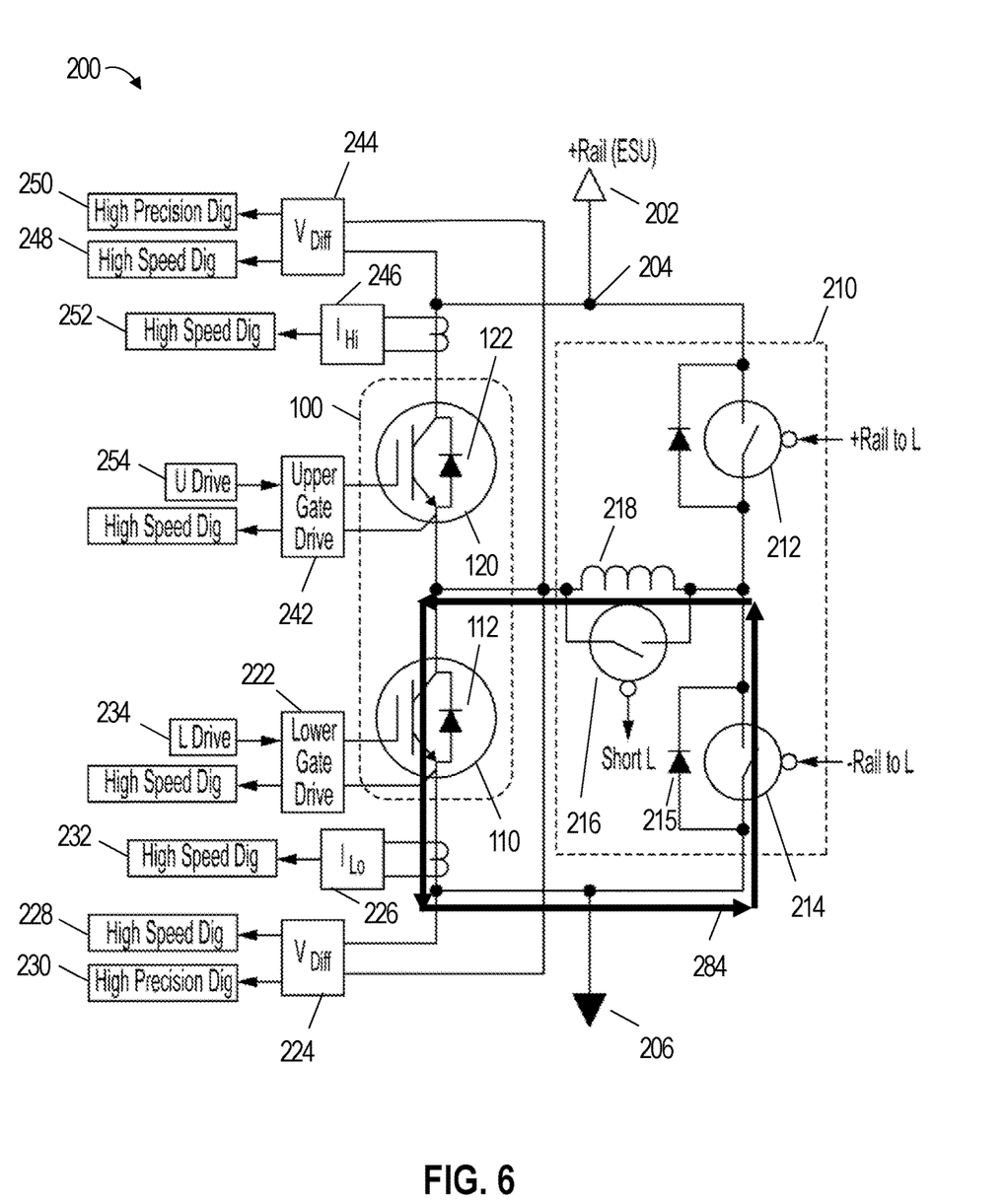
FIG. 6 is a schematic diagram showing the exemplary ATE during a fourth test phase for testing high-power components, according to some aspects.

FIG. 6 is a schematic diagram showing the exemplary ATE 200 during a fourth test phase for testing high-power components, according to some aspects. The inventor has recognized and appreciated that as the inductor current increases to very high levels during one or more test phases where the lower IGBT is turned on, there is a need to provide an alternate means for safe turn-off that will allow testing both the IGBT and the FRD at the required much higher DC test currents. FIG. 6 shows an exemplary test phase, where by turning off the +Rail to L switch 212, the free inductor lead's voltage transitions downward until it forward biases an internal diode 215 within the −Rail to L switch 214. This leaves the lower IGBT 110 on and causes current to flow in a circuit path 284 that can be safe from excessive energy and overvoltage from turning off the current supply from ESU 202.

Figure 7:
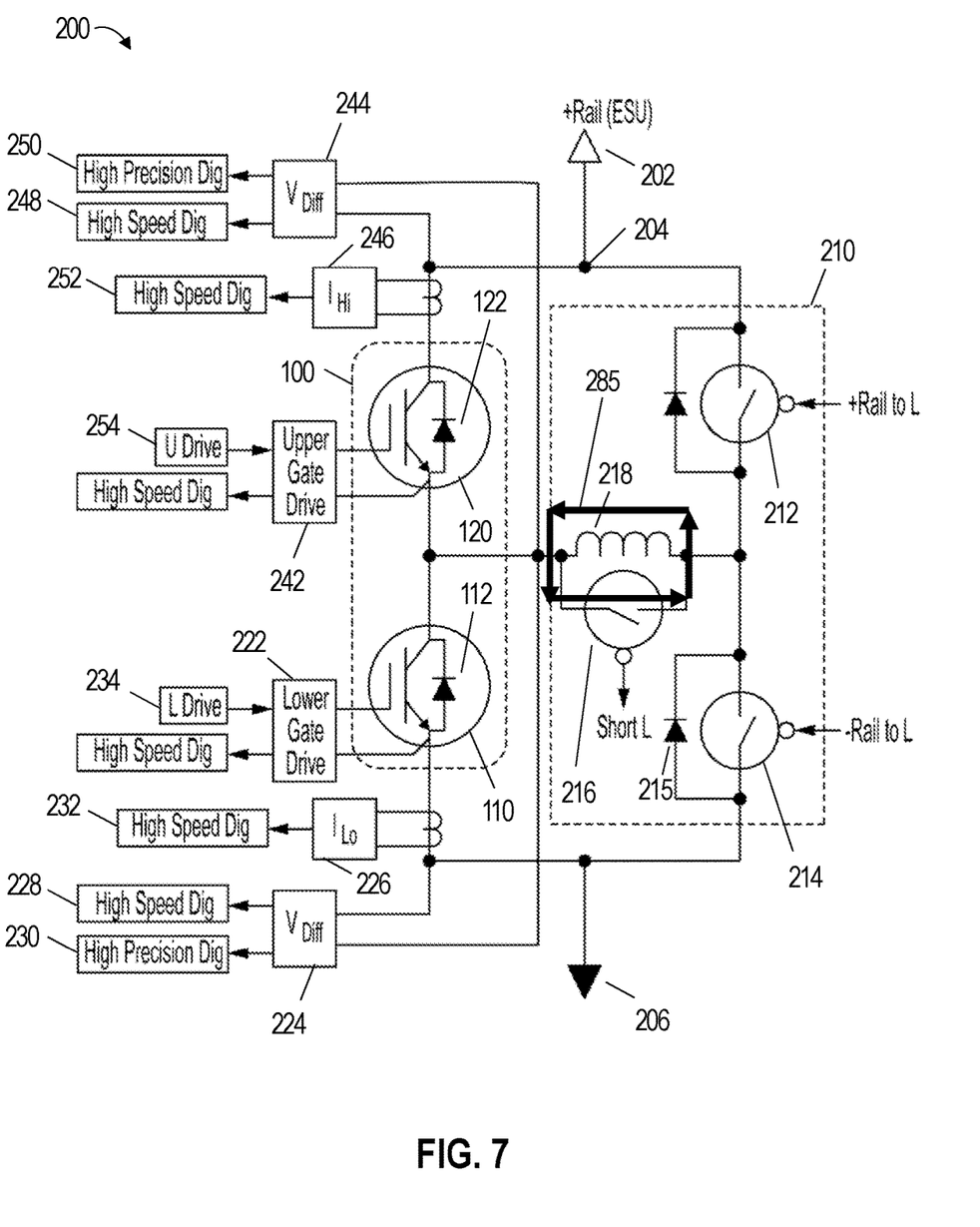
FIG. 7 is a schematic diagram showing the exemplary ATE during a fifth test phase for testing high-power components, according to some aspects.

FIG. 7 is a schematic diagram showing the exemplary ATE 200 during a fifth test phase for testing high-power components, according to some aspects. The fifth test phase may be performed subsequent to the fourth test phase shown in FIG. 6. As shown in FIG. 7, the shorting switch 216 across the inductive load is turned on, while the lower IGBT is turned off. This contains the inductor energy within the inductor 218 and shorting switch 216 in preparation for use in testing the upper IGBT 120 and FRD 122.

Figure 8:
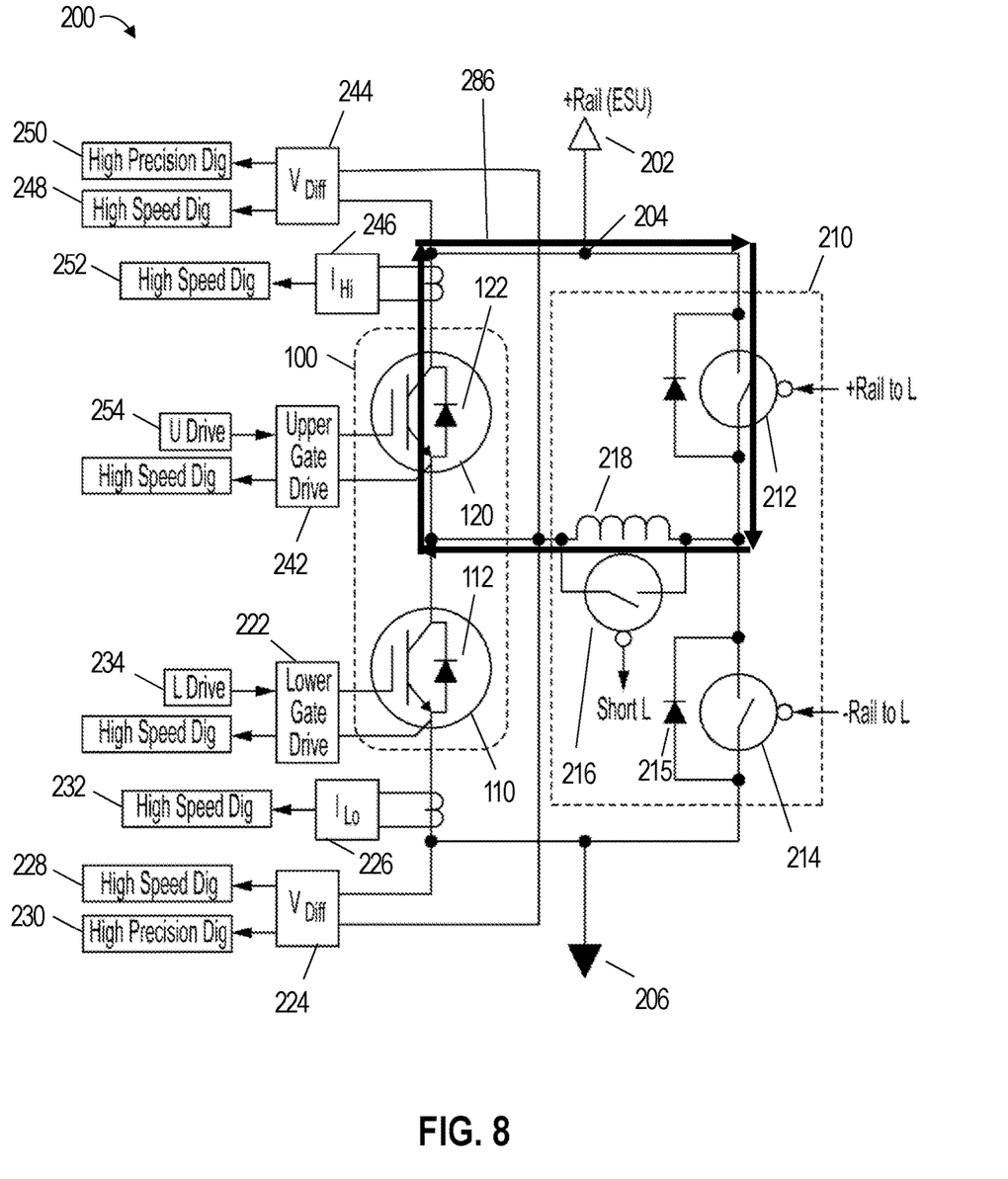
FIG. 8 is a schematic diagram showing the exemplary ATE during a sixth test phase for testing high-power components, according to some aspects.

FIG. 8 is a schematic diagram showing the exemplary ATE 200 during a sixth test phase for testing high-power components, according to some aspects. The sixth test phase may be performed subsequent to the fifth test phase shown in FIG. 7, and used to test upper IGBT 120 and FRD 122.

To test the upper FRD 122, the +Rail to L switch 212 is turned on and the shorting switch 216 is turned off in sequence, which allows current in the inductor 218 to begin flowing through the upper FRD 122 via a circuit path 286. The resulting V(forward) and I(forward) waveforms are then digitized in a synchronized timing using digitizers 248, 250 and 252. The action is safe for the DUT since the voltage across the device is minimal, which keeps the switching energy low. When the test is complete, the shorting switch 216 can be closed again and the +Rail to L switch 212 can be opened.

It should be appreciated that the test phases illustrated in FIGS. 2, 4, 5, 6, 7 and 8 can be repeated a number of times for additional desired test cases as long as the power requirements of the ISM are not exceeded. Multiple pattern based tests are also possible, for example, to test the upper IGBT and lower FRD switching pair.

Figure 9:
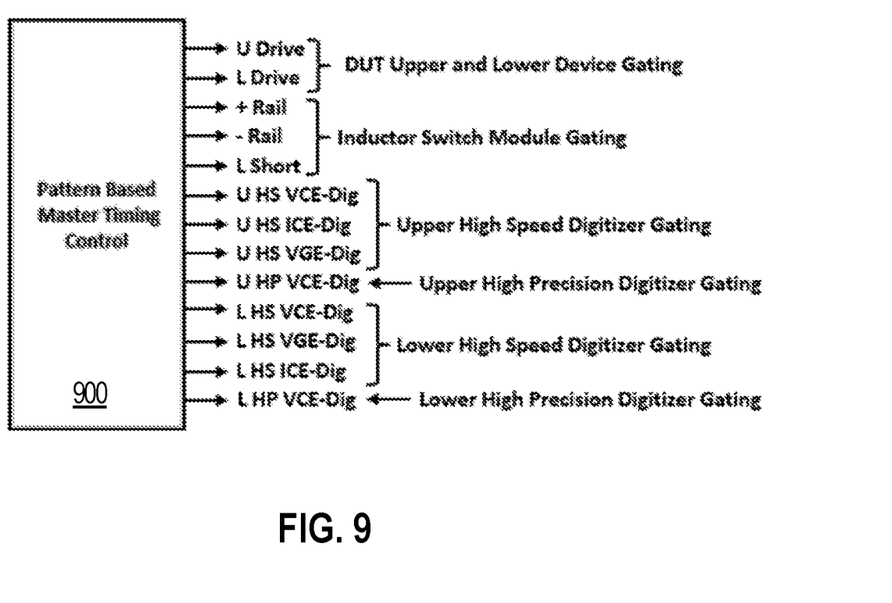
FIG. 9 is a schematic diagram showing an exemplary pattern based timing control engine, according to some aspects.

FIG. 9 is a schematic diagram showing an exemplary pattern based timing control engine 900, according to some aspects. The AC and DC testing in the ATE as described herein is a pattern-based testing where test execution is orchestrated in the hardware by a plurality of synchronized control signals generated in a pattern based timing control engine 900. As shown in FIG. 9, pattern based timing control engine 900 can generate control signals to drive gating of the DUT upper and lower IGBT devices, gating of switches in the ISM, gating of the high-speed voltage/current digitizers and the high-precision voltage digitizers for testing both the upper and lower IGBTs. The pattern based timing control engine 900 may be implemented in hardware, such as with one or more digital sequencers having precise timing control, and may be programmable by an operator, for example in test computer 12 as shown in FIG. 1.

Having thus described several aspects of at least one embodiment of this invention, it is to be appreciated that various alterations, modifications, and improvements will readily occur to those skilled in the art.

For example, the measured current and voltage data may be further processed to remove noise, such as by using a central moving average method. A central moving average is performed averaging an odd number of samples having an equal number of samples on either side of the central sample. This mechanism provides noise reduction or data smoothing appropriate to the sample size without introducing a time shift into the data. In a synchronized environment with multiple digitizers, this mechanism is used to associate particular voltage samples in time with particular current samples while reducing measurement variance. In the test system as described herein, where the measured signals include dynamic DC data with voltage and current waveforms ramping in a near-linear fashion, the central moving average is a very effective technique for locating particular measure points within a constantly changing dataset. The combination of current guard-banding and measurement noise reduction provides improved accuracy to maintain high product quality and test yield.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method for operating an automated testing equipment (ATE) to test an insulated-gate bipolar transistor (IGBT) in a device under test (DUT), the method comprising:
   turning on the IGBT;
   driving a current from an energy source unit (ESU) through the IGBT via an inductor;
   measuring a plurality of current waveforms through and voltage waveforms across the IGBT;
   processing the plurality of measured current waveforms and voltage waveforms to obtain at least one alternating-current (AC) characteristic and at least one direct-current (DC) characteristic of the IGBT, wherein the at least one DC characteristic is a collector to emitter voltage at saturation ($V_{CE}$) or a forward voltage ($V_{FRD}$) of an internal diode of the IGBT, processing the plurality of measured current waveforms and voltage waveforms to obtain the at least one DC characteristic comprises processing at least one voltage waveform measured during an on-state of the IGBT, the at least one AC characteristic is a switching energy of the IGBT, and wherein processing the plurality of measured current waveforms and voltage waveforms to obtain the at least one AC characteristic comprises processing at least one voltage waveform measured across an on-off transition of the IGBT;

with a first digitizer of the ATE, measuring the at least one voltage waveform measured during an on-state of the IGBT; and with a second digitizer of the ATE, measuring the at least one voltage waveform across an on-off transition of the IGBT, wherein the second digitizer has a lower voltage resolution than the first digitizer.

2. The method of claim 1, further comprising:
generating, with a controller, a plurality of synchronized control signals that are synchronized with a timing pattern;
controlling switching of the IGBT and sampling of the first digitizer and the second digitizer based at least in part on the plurality of synchronized control signals.

3. An automated test equipment (ATE) for testing a device under test (DUT), comprising:
an energy source unit (ESU) comprising an ESU output;
a switch module configured to couple a transistor in the DUT to the ESU output via an inductor;
a first digitizer configured to measure a voltage of the transistor;
a second digitizer configured to measure the voltage of the transistor with a lower voltage resolution than the first digitizer; and
a third digitizer configured to measure a current of the transistor.

4. The ATE of claim 3, wherein the ATE is configured to sample the first digitizer and operate one or more switches in the switch module based on a plurality of synchronized control signals.

5. The ATE of claim 4, wherein the ATE is configured to cycle the transistor on and off based on the plurality of synchronized control signals, and wherein the ATE is configured to sample the first digitizer during a period when the transistor is turned on.

6. The ATE of claim 5, wherein the transistor is an insulated-gate bipolar transistor (IGBT).

7. The ATE of claim 6, wherein the first digitizer is configured to measure one or more characteristics of the transistor when the transistor is turned on, wherein the one or more characteristics comprises a collector to emitter voltage at saturation ($V_{CE}$), a forward voltage ($V_{FRD}$), or combinations thereof.

8. The ATE of claim 7, wherein the one or more characteristics comprises a $V_{CE}$ or a $V_{FRD}$ measured when the current of the transistor is at least 3000 A.

9. The ATE of claim 8, wherein the transistor is a first IGBT, and the inductor in the switch module has a first inductor terminal configured to be coupled to the first IGBT, and wherein the switch module is further configured to couple a second IGBT between the first inductor terminal and the ESU output.

10. The ATE of claim 9, wherein the ATE further comprises:
a fourth digitizer configured to measure a voltage of the second IGBT;
a fifth digitizer configured to measure the voltage of the second IGBT with a lower voltage resolution than the fifth digitizer;
a sixth digitizer configured to measure a current of the second IGBT,
wherein the ATE is configured to sample the fourth digitizer based on the plurality of synchronized control signals.

11. The ATE of claim 9, wherein a first switch of the one or more switches in the switch module is in parallel with the inductor, the first switch configured to be operated based on a synchronized control signal of the plurality of synchronized control signals.

12. The ATE of claim 11, wherein a second inductor terminal of the inductor is coupled to the ESU output via a second switch of the one or more switches, the second switch configured to be operated based on a synchronized control signal of the plurality of synchronized control signals.

13. The ATE of claim 12, wherein the second inductor terminal of the inductor is coupled to a reference voltage via a third switch of the one or more switches, the third switch configured to be operated based on a synchronized control signal of the plurality of synchronized control signals.

14. The ATE of claim 13, wherein the switch module is configured to couple the transistor in the DUT between the first inductor terminal of the inductor and the reference voltage.

15. The ATE of claim 4, further comprising a controller configured to provide a plurality of synchronized control signals to the second digitizer and the one or more switches in the switch module, wherein the plurality of synchronized control signal are synchronized with a common timing pattern.

16. A method for operating an automated testing equipment (ATE) to test a first insulated-gate bipolar transistor (IGBT) in a device under test (DUT), the method comprising:
turning on the first IGBT to cause a first current to flow from an energy source unit (ESU) output towards a reference voltage via a first circuit path, the first circuit path comprising an inductor, a first switch coupled between the inductor and the ESU output, and the first IGBT;
measuring, with a first digitizer, a first characteristic of the first IGBT;
measuring, with a second digitizer having a lower voltage resolution than the first digitizer, a second characteristic of the first IGBT.

17. The method of claim 16, wherein the first characteristic is a collector to emitter voltage at saturation ($V_{CE}$) or a forward voltage ($V_{FRD}$), and wherein measuring the first characteristic is performed during an on-state of the first IGBT when the first current is flowing through the first IGBT.

18. The method of claim 17, wherein the first current is at least 3000 A.

19. The method of claim 16, further comprising:
subsequent to turning on the first IGBT, turning off the first IGBT to cause a second current to flow from the ESU output via a second circuit path, the second circuit path comprising the first switch, the inductor and a second IGBT, wherein measuring the second characteristic is performed around a transition between an on-state and an off-state of the first IGBT, and wherein the second characteristic is a switching energy of the first IGBT.

20. The method of claim 19, further comprising:

measuring, with a third digitizer, a third characteristic of the second IGBT during an on-state of the second IGBT when the second current is flowing through the second IGBT.

21. The method of claim 16, further comprising:

disconnecting the inductor from the ESU output by turning off the first switch;

turning on a second switch coupled between the inductor and the reference voltage to cause a third current to flow via a third current path, wherein the third current path is a loop that comprises the inductor, the first IGBT and a second switch.

22. The method of claim 16, further comprising:

generating, with a controller, a plurality of synchronized control signals that are synchronized with a common timing pattern;

controlling switching of the first IGBT and the first switch, and sampling of the first digitizer and the second digitizer based at least in part on the plurality of synchronized control signals.

23. The method of claim 16, wherein measuring the first characteristic comprises:

sampling a voltage across the first IGBT versus the first current;

performing a moving average of the sampled voltage across the first IGBT.

24. The method of claim 16, further comprising:

protecting the first digitizer from overvoltage condition by limiting a voltage at the first digitizer to be within a predetermined voltage range.

\* \* \* \* \*